(12) United States Patent
Haba et al.

(10) Patent No.: US 8,067,267 B2
(45) Date of Patent: Nov. 29, 2011

(54) MICROELECTRONIC ASSEMBLIES HAVING VERY FINE PITCH STACKING

(75) Inventors: Belgacem Haba, Saratoga, CA (US); Craig S. Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/318,164

(22) Filed: Dec. 23, 2005

(65) Prior Publication Data
US 2007/0148819 A1    Jun. 28, 2007

(51) Int. Cl.
*H01L 21/00* (2006.01)

(52) U.S. Cl. ........ 438/107; 438/106; 438/108; 438/109; 438/118; 438/121; 438/123

(58) Field of Classification Search .......... 438/106–109, 438/118, 121, 123
See application file for complete search history.

(56) References Cited

U.S. PATENT DOCUMENTS

| | | |
|---|---|---|
| 4,695,870 A | 9/1987 | Patraw |
| 4,716,049 A | 12/1987 | Patraw |
| 4,791,075 A | 12/1988 | Lin |
| 4,804,132 A | 2/1989 | Difrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,991,000 A | 2/1991 | Bone et al. |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,189,505 A | 2/1993 | Bartelink |
| 5,196,726 A | 3/1993 | Nishiguchi et al. |

(Continued)

FOREIGN PATENT DOCUMENTS

JP    62-68015 A    9/1994

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

(Continued)

*Primary Examiner* — Fernando L Toledo
*Assistant Examiner* — Jae Lee
(74) *Attorney, Agent, or Firm* — Lerner, David, Littenberg, Krumholz & Mentlik, LLP

(57) ABSTRACT

A method of making a stacked microelectronic assembly includes providing a first microelectronic package that includes a first substrate having a first dielectric layer, conductive posts, and conductive traces extending along the surface of the first dielectric layer; providing a second microelectronic package including a second substrate that includes a second dielectric layer; securing a microelectronic element to one of the surfaces of at least one of the first or second substrates; and joining the conductive posts of the first substrate with the fusible masses of the second substrate. The posts may include a plurality of aligned posts which are aligned in a first row extending in a single orthogonal direction along a surface of the first substrate away from a portion of the first substrate that faces a face of the microelectronic element. The aligned posts are disposed beyond one of the edges of the microelectronic element.

43 Claims, 8 Drawing Sheets

U.S. PATENT DOCUMENTS

| | | | |
|---|---|---|---|
| 5,214,308 A | 5/1993 | Nishiguchi et al. | |
| 5,222,014 A | 6/1993 | Lin | |
| 5,229,647 A | 7/1993 | Gnadinger | |
| 5,397,997 A | 3/1995 | Tuckerman et al. | |
| 5,432,999 A | 7/1995 | Capps et al. | |
| 5,455,390 A | 10/1995 | DiStefano et al. | |
| 5,518,964 A | 5/1996 | DiStefano et al. | |
| 5,615,824 A | 4/1997 | Fjelstad et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,726,493 A | 3/1998 | Yamashita et al. | |
| 5,731,709 A | 3/1998 | Pastore et al. | |
| 5,802,699 A | 9/1998 | Fjelstad et al. | |
| 5,811,982 A | 9/1998 | Beaman et al. | |
| 5,818,748 A | 10/1998 | Bertin et al. | |
| 5,854,507 A | 12/1998 | Miremadi et al. | |
| 5,861,666 A | 1/1999 | Bellaar | |
| 5,973,391 A | 10/1999 | Bischoff et al. | |
| 5,980,270 A | 11/1999 | Fjelstad et al. | |
| 6,032,359 A | 3/2000 | Carroll | |
| 6,052,287 A | 4/2000 | Palmer et al. | |
| 6,054,756 A | 4/2000 | DiStefano et al. | |
| 6,133,626 A | 10/2000 | Hawke et al. | |
| 6,177,636 B1 * | 1/2001 | Fjelstad | 174/267 |
| 6,188,127 B1 * | 2/2001 | Senba et al. | 257/686 |
| 6,202,297 B1 | 3/2001 | Faraci et al. | |
| 6,258,625 B1 | 7/2001 | Brofman et al. | |
| 6,332,270 B2 | 12/2001 | Beaman et al. | |
| 6,358,627 B2 | 3/2002 | Benenati et al. | |
| 6,362,525 B1 | 3/2002 | Rahim | |
| 6,383,840 B1 | 5/2002 | Hashimoto et al. | |
| 6,451,626 B1 | 9/2002 | Lin et al. | |
| 6,458,411 B1 | 10/2002 | Goossen et al. | |
| 6,476,503 B1 | 11/2002 | Imamura et al. | |
| 6,495,914 B1 | 12/2002 | Sekine et al. | |
| 6,509,639 B1 | 1/2003 | Lin et al. | |
| 6,514,847 B1 | 2/2003 | Ohsawa et al. | |
| 6,515,355 B1 | 2/2003 | Jiang et al. | |
| 6,522,018 B1 | 2/2003 | Tay et al. | |
| 6,525,413 B1 | 2/2003 | Cloud et al. | |
| 6,550,666 B2 | 4/2003 | Chew et al. | |
| 6,555,918 B2 | 4/2003 | Masuda et al. | |
| 6,560,117 B2 | 5/2003 | Moon | |
| 6,578,754 B1 | 6/2003 | Tung | |
| 6,624,653 B1 | 9/2003 | Cram | |
| 6,642,615 B2 | 11/2003 | Hashimoto et al. | |
| 6,647,310 B1 | 11/2003 | Yi et al. | |
| 6,683,374 B2 | 1/2004 | Goller et al. | |
| 6,706,557 B2 | 3/2004 | Koopmans | |
| 6,756,305 B1 | 6/2004 | Conn | |
| 6,765,287 B1 * | 7/2004 | Lin | 257/686 |
| 6,782,610 B1 | 8/2004 | Iijima et al. | |
| 6,794,741 B1 | 9/2004 | Lin et al. | |
| 6,847,105 B2 | 1/2005 | Koopmans | |
| 6,884,709 B2 | 4/2005 | Iijima et al. | |
| 6,902,869 B2 | 6/2005 | Appelt et al. | |
| 6,962,865 B2 | 11/2005 | Hanaoka et al. | |
| 7,067,911 B1 | 6/2006 | Lin et al. | |
| 2001/0028105 A1 | 10/2001 | Hashimoto et al. | |
| 2002/0125571 A1 | 9/2002 | Corisis et al. | |
| 2002/0153602 A1 | 10/2002 | Tay et al. | |
| 2003/0042590 A1 | 3/2003 | Goller et al. | |
| 2003/0057539 A1 | 3/2003 | Koopmans | |
| 2003/0164540 A1 | 9/2003 | Lee et al. | |
| 2003/0164551 A1 | 9/2003 | Lee et al. | |
| 2003/0189257 A1 | 10/2003 | Corisis et al. | |
| 2003/0203537 A1 | 10/2003 | Koopmans | |
| 2004/0061212 A1 | 4/2004 | Karnezos | |
| 2004/0121632 A1 * | 6/2004 | Takata | 439/83 |
| 2004/0197962 A1 | 10/2004 | Iijima et al. | |
| 2004/0201096 A1 | 10/2004 | Iijima et al. | |
| 2004/0241908 A1 | 12/2004 | Choi | |
| 2004/0251523 A1 | 12/2004 | Takiar | |
| 2005/0000729 A1 | 1/2005 | Iljima et al. | |
| 2005/0009329 A1 | 1/2005 | Tanida et al. | |
| 2005/0014311 A1 | 1/2005 | Hayasaka et al. | |
| 2005/0097727 A1 | 5/2005 | Iijima et al. | |
| 2005/0161804 A1 | 7/2005 | Iijima et al. | |
| 2006/0012037 A1 * | 1/2006 | Raedt et al. | 257/737 |

OTHER PUBLICATIONS

North Corporation, "Processed Intra-layer Interconnection Material for PWBs [Etched Copper Bump with Copper Foil]," NMBI™, Version 2001.6.

North Corporation "NMBI® •NMSS™ Technical Doocument" The First Edition, Oct. 25, 2003.

* cited by examiner

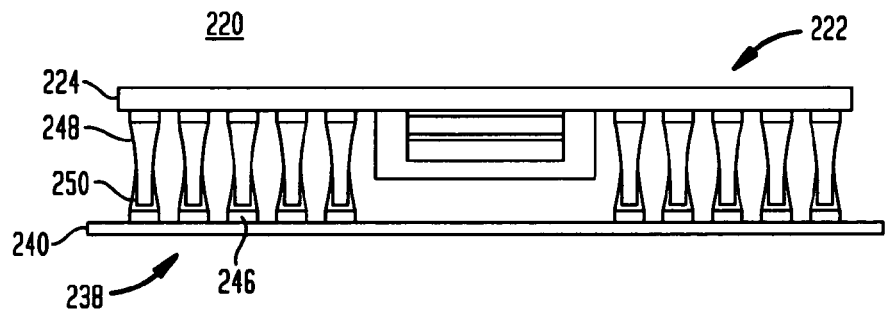
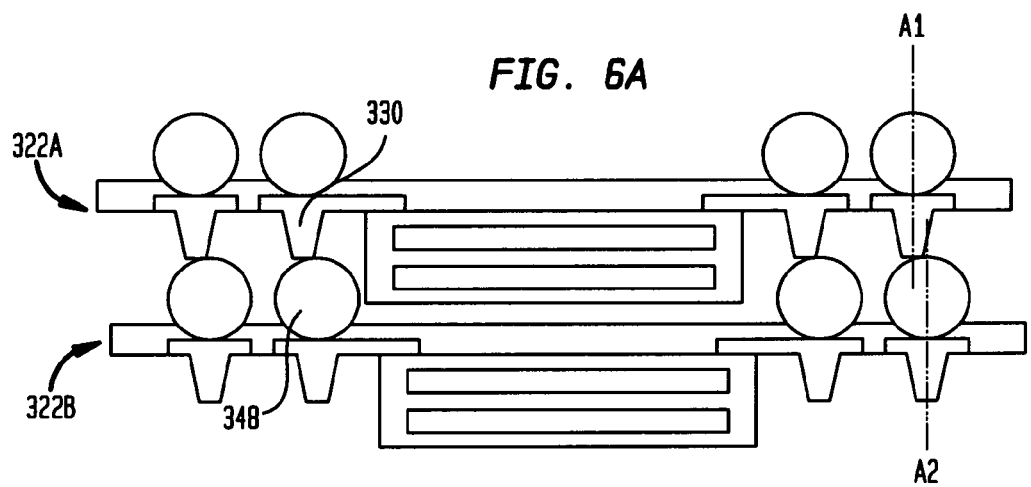
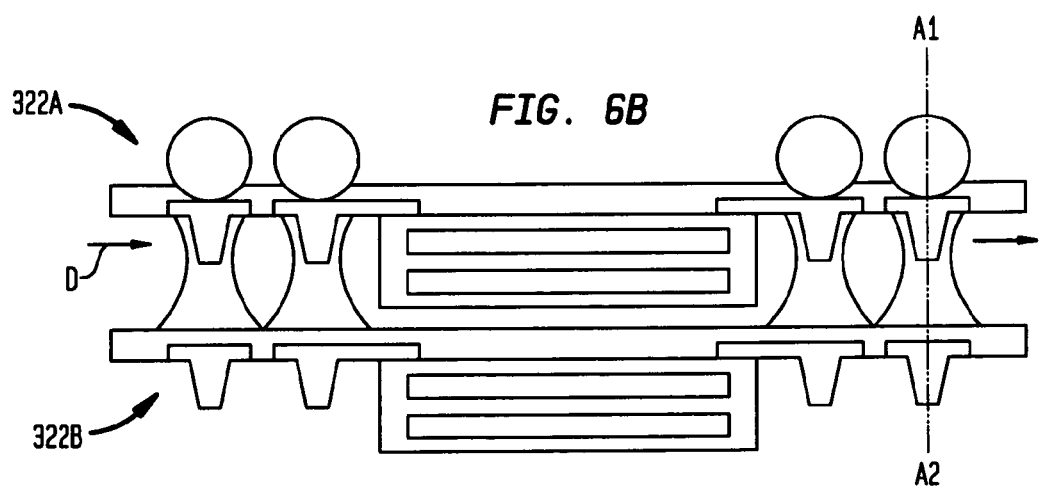

MICROELECTRONIC ASSEMBLIES HAVING VERY FINE PITCH STACKING

The present invention relates to microelectronic assemblies and to methods of making and testing stackable microelectronic assemblies.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices used for high-frequency operation are typically tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

As disclosed in certain preferred embodiments in co-pending, commonly assigned U.S. patent application Ser. No. 10/985,126, filed Nov. 10, 2004, entitled "MICRO PIN GRID ARRAY WITH WIPING ACTION", the disclosure of which is hereby incorporated herein by reference, a microelectronic package includes conductive posts that promote wiping action and facilitate engagement of the conductive posts and the contacts. In one preferred embodiment, the tip end or upper extremity of each post may be horizontally offset from the center of the base of that post. Such offset can be used in addition to, or in lieu of, the features discussed above for promoting tilting of the posts. Also, the posts can be provided with features such as sharp edges or asperities for promoting more reliable engagement with contact pads.

As discussed in greater detail in the co-pending, commonly assigned U.S. patent application Ser. No. 11/014,439, filed Dec. 16, 2004, entitled "MICROELECTRONIC PACKAGES AND METHODS THEREFOR", the disclosure of which is hereby incorporated herein by reference, a support structure may include a plurality of spaced apart support elements and may also include a flexible sheet overlying the support elements. Conductive posts may be offset in horizontal directions from the support elements. The offset between the posts and the support elements allows the posts, and particularly the bases of the posts, to move independently of one another relative to a microelectronic element.

Microelectronic packages having conductive terminals or posts that are able to move independently of one another is also disclosed in greater detail in co-pending, commonly assigned U.S. patent application Ser. No. 10/985,119, filed on Nov. 10, 2004, entitled "MICRO PIN GRID WITH PIN MOTION ISOLATION", the disclosure of which is hereby incorporated herein by reference.

Microelectronic elements such as semiconductor chips ordinarily are mounted on circuit panels such as circuit boards. For example, a packaged semiconductor chip may have an array of bonding contacts on a bottom surface of the package. Such a package can be mounted to a corresponding array of bonding contacts exposed at a top surface of a circuit board by placing the package on the circuit board with the bottom surface of the package facing downwardly and confronting the top surface of the circuit board, so that each bonding contact on the package is aligned with a corresponding bonding contact on the circuit board. Masses of a conductive bonding material, typically in the form of solder balls, are provided between the bonding contacts of the package and the bonding contacts of the circuit board. In typical surface-mounting techniques, solder balls are placed on the bonding contacts of the package before the package is applied to the circuit board.

Ordinarily, numerous microelectronic elements are mounted side-by-side on the circuit board and interconnected to one another by electrically conductive traces connecting the various bonding contacts. Using this conventional approach, however, the circuit board must have an area at least equal to the aggregate area of all of the microelectronic elements. Moreover, the circuit board must have all of the traces needed to make all of the interconnections between microelectronic elements. In some cases, the circuit board must include many layers of traces to accommodate the required interconnections. This materially increases the cost of the circuit board. Typically, each layer extends throughout the entire area of the circuit board. Stated another way, the number of layers in the entire circuit board is determined by the number of layers required in the area of the circuit board having the most complex, densely packed interconnections. For example, if a particular circuit requires six layers of traces in one small region but only requires four layers in the remainder of the circuit board, the entire circuit board must be fabricated as a six-layer structure.

These difficulties can be alleviated to some degree by connecting related microelectronic elements to one another using an additional circuit panel so as to form a sub-circuit or module, which, in turn, is mounted to the main circuit board. The main circuit board need not include the interconnections made by the circuit panel of the module. It is possible to make such a module in a "stacked" configuration, so that some of the chips or other microelectronic elements in the module are disposed on top of other chips or microelectronic elements in the same module. Thus, the module as a whole can be mounted in an area of the main circuit board less than the aggregate area of the individual microelectronic elements in the module. However, the additional circuit panel and the additional layer of interconnections between this circuit panel and the main circuit board consume additional space. In particular, the additional circuit panel and additional layer of interconnections between the additional circuit panel and the main circuit board add to the height of the module, i.e., the distance by which the module projects above the top surface of the main circuit board. This is particularly significant where the module is provided in a stacked configuration and where low height is essential, as, for example, in assemblies intended for use in miniaturized cellular telephones and other devices to be worn or carried by the user.

The additional space consumed by mounting pre-packaged semiconductor chips on a separate module circuit panel can be saved by integrating the circuit panel of the module with a part of the package itself, commonly referred to as a package substrate. For example, several bare or unpackaged semiconductor chips can be connected to a common substrate during the chip packaging operation. Packages of this nature can also be made in a stacked arrangement. Such multi-chip packages can include some or all of the interconnections among the various chips in the package and can provide a very compact assembly. The main circuit board can be simpler than that which would be required to mount individual packaged chips in the same circuit. However, this approach requires unique packages for each combination of chips to be included in the package. For example, in the cellular telephone industry, it is a common practice to use the same field programmable gate array ("FPGA") or application specific integrated circuit ("ASIC") with different combinations of static random access memory ("SRAM") and flash memory so as to provide different features in different cellular telephones. This increases the costs associated with producing, handling and stocking the various packages.

Despite all of the above-described advances in the art, still further improvements in making and testing microelectronic packages would be desirable.

SUMMARY OF THE INVENTION

In certain preferred embodiments of the present invention, a method of making a stacked microelectronic assembly includes providing a first microelectronic package having a first substrate and conductive posts extending from a surface of the first substrate, each conductive post having a vertical height that extends from the surface of the first substrate to a tip of the conductive post. The method preferably includes providing a second microelectronic package including a second substrate and conductive, fusible masses extending from a surface of the second substrate, each fusible mass having a vertical height that extends from the surface of the second substrate to an apex of the fusible mass. A microelectronic element is desirably secured over one of the surfaces of the first and second substrates, the microelectronic element defining a vertical height that extends from the surface of the first and second substrate to which the microelectronic element is secured. The surface of the first substrate is preferably juxtaposed with the surface of the second substrate so that the conductive posts are in substantial alignment with the fusible masses. The tips of the conductive posts are desirably abutted against the apexes of the fusible masses, whereby the vertical height of each conductive post/fusible mass combination is equal to or greater than the vertical height of the microelectronic element secured to the one of the surfaces of the first and second substrates.

In other preferred embodiments, a microelectronic assembly preferably includes two or more microelectronic packages stacked at a fine pitch, which is finer than the pitch that is possible when using solder balls for making the joint. Each stackable package desirably includes a substrate having pins projecting from one surface of the substrate and solder balls projecting from the other surface of the substrate. As a result, each package may be stacked with another similarly constructed package and/or placed in a multi-layer stacked assembly. Each stackable package may have one or more die attached to one or more of the surfaces of the substrate. In certain embodiments, die may be attached to both surfaces of the substrate. The dies may be electrically interconnected with the substrate using any method known to those skilled in the art including using wire bonds, flip chip bonding, leads and/or stud bumping. The die may be encapsulated in an encapsulant material, under-filled or glob topped. In certain preferred embodiments, the combination of the conductive post height and ball height is equal to or greater than the height of the encapsulated or molded chip structure that is provided on the substrate. The combination of the conductive post height and the ball height must be at least equal to the height of the encapsulated chip structure so that the conductive elements (e.g., the conductive posts and the opposing solder balls) are able to span the gap between layers of the assembly.

After the tips of the conductive pads are in contact with the solder masses, the solder masses are desirably reflowed to form a permanent electrical interconnection between the stacked microelectronic packages. During reflow, the reflowed solder will wick up around the conductive posts to form elongated solder columns. In addition, when the solder is reflowed, surface tension pulls the opposing layers of the assembly toward one another and provides a self-centering action for the conductive posts.

Although the present invention is not limited by any particular theory of operation, it is believed that providing stackable packages having conductive posts projecting from one surface of a substrate and fusible masses projecting from another surface of the substrate provides a number of advantages over conventional packages. First, using conductive posts for spanning part of the gap between the layers of a stack allows for a finer pitch for the electrical interconnections. Second, the conductive posts can span most of the gap between the layers of the stack so that the opposing solder balls can be very small, which further facilitates using a fine pitch. In addition, using elongated conductive posts provides a larger surface area for the reflowed fusible material to grip to, so as to enhance surface tension between the posts and the reflowed material. Moreover, the reflowed fusible material will seek to completely surround the outer surfaces of the conductive posts, which will tend to center/align the posts with the conductive fusible masses.

In certain preferred embodiments, the substrate may be flexible, and may include a dielectric material such as a polyimide. The microelectronic element is desirably electrically interconnected with the substrate, such as by using conductive leads, wires or traces. The microelectronic element may be a semiconductor chip having a front face with contacts and a back face remote therefrom. In certain preferred embodiments, the front face of the semiconductor chip faces the substrate. In other preferred embodiments, however, the front face of the semiconductor chip faces away from the substrate and the back face of the semiconductor chip faces the substrate. A compliant layer may be disposed between the microelectronic element and the substrate. In other preferred embodiments, a package may include two or more microelectronic elements overlying a substrate. In one preferred embodiment, one or more microelectronic elements overlie a top surface of a substrate. In a second preferred embodiment, one or more microelectronic elements overlie a bottom surface of a substrate. In yet another preferred embodiment, one or more microelectronic elements overlie a first surface of a substrate and one or more microelectronic elements may overlie a second surface of the substrate. The microelectronic elements may be encapsulated.

Yet another aspect of the invention provides methods of processing microelectronic packages. Method according to this aspect of the invention desirably include the step of advancing a microelectronic package having a flexible substrate supported over a surface of a microelectronic element and having electrically conductive posts projecting from said substrate until tips of said posts engage contact pads on a test circuit panel and the substrate flexes so that at least some base portions of said posts adjacent said flexible substrate move relative to the microelectronic element. In preferred methods according to this aspect of the present invention, movement of the bases of the posts contribute to movement of the tips, allowing the tips to engage contact pads even where the contact pads themselves are not coplanar with one another.

The method according to this aspect of the invention may include the further steps of maintaining the tips of the posts in contact with said contact pads and testing the package during the maintaining step, as by transmitting signals to and from the package through the engaged contact pads and posts. The method may be practiced using a simple circuit panel, with simple contact pads. The method may further include disengaging the tips from the contact pads after testing, and may also include bonding the tips of the posts to electrically conductive elements of a circuit panel after disengagement from the test circuit panel.

The mounting structure may include a flexible substrate, which may have conductive traces formed thereon for electrically interconnecting the posts with a microelectronic element. The flexible substrate may be a generally sheet like substrate extending substantially in a horizontal plane, the substrate having a top surface and a bottom surface, the conductive posts projecting upwardly from the top surface. The flexible substrate may also include a plurality of gaps extending through the substrate and defining a plurality of regions, different ones of the posts being disposed on different ones of the regions such as disclosed in commonly assigned U.S. patent application Ser. No. 10/985,119, entitled "MICRO PIN GRID WITH PIN MOTION ISOLATION," filed on Nov. 10, 2004, the disclosure of which is hereby incorporated herein by reference. The package may incorporate a support layer such as a compliant layer disposed between the flexible substrate and the microelectronic element. In other embodiments, the package may include a plurality of support elements spaced apart from one another and disposed between the flexible substrate and the microelectronic element, the bases of the posts being spaced horizontally from the support elements as described in greater detail in the co-pending, commonly assigned U.S. patent application Ser. No. 11/014,439, entitled "MICROELECTRONIC PACKAGES AND METHODS THEREFOR," filed on Dec. 16, 2004, the disclosure of which is hereby incorporated herein by reference.

The microelectronic element of the package preferably has faces and contacts, the contacts being electrically interconnected with the conductive posts and/or the fusible masses. In certain embodiments, the contacts are exposed at a first face of the microelectronic element and the mounting structure overlies the first face. In other embodiments, the contacts are exposed at a first face of the microelectronic element and the mounting structure overlies a second, oppositely directed face of the microelectronic element.

A still further aspect of the invention provides methods of making microelectronic packages and elements of such packages. A method according to this aspect of the invention desirably includes providing a blank made of a conductive material such as copper, applying a fluid under pressure, desirably a liquid, to the blank to form at least one conductive terminal in the blank, and providing electrical interconnections to the at least one conductive terminal. The at least one conductive terminal may be a conductive post. The method may also include heating the blank so as to make the blank more ductile during the forming operation.

The assembly also desirably includes a plurality of support elements disposed between the microelectronic element and the substrate. The support elements desirably support the flexible substrate over the microelectronic element, with at least some of the conductive posts being offset from the support elements. A compliant material may be disposed between the flexible substrate and the microelectronic element.

In certain preferred embodiments, at least one of the conductive support elements includes a mass of a fusible material. In other preferred embodiments, at least one of the conductive support elements includes a dielectric core and an electrically conductive outer coating over the dielectric core. The support element may also be elongated, having a length that is greater than its width or diameter.

The microelectronic element may be a printed circuit board or a test board used to test devices such as microelectronic elements and microelectronic packages. The first face of the microelectronic element may be a front face of the microelectronic element and the contacts may be accessible at the front face. In certain preferred embodiments, at least some of the support elements are electrically conductive. The conductive support elements desirably electrically interconnect at least some of the contacts of the microelectronic element with at least some of the conductive posts. In certain preferred embodiments, the support elements include a plurality of second conductive posts extending from the flexible substrate. The second conductive posts preferably project toward the first face of the microelectronic element, with at least some of the second conductive posts being electrically interconnected with the first conductive posts. In certain preferred embodiments, a first conductive post is electrically interconnected to a contact through a second conductive post disposed immediately adjacent to the first conductive post.

The conductive posts may be elongated, whereby the posts have a length that is substantially greater than the width or diameter of the posts. The support elements may be disposed in an array so that the support elements define a plurality of zones on the flexible substrate, each zone being bounded by a plurality of the support elements defining corners of the zone, with different ones of the conductive posts being disposed in different ones of the zones. In preferred embodiments, only one of the conductive posts is disposed in each of the zones.

In another preferred embodiments of the present invention, a microelectronic assembly includes a microelectronic element having faces and contacts, a flexible substrate spaced from and overlying a first face of the microelectronic element, and a plurality of first conductive posts extending from the flexible substrate and projecting away from the first face of the microelectronic element, at least some of the conductive posts being electrically interconnected with the microelectronic element. The assembly also desirably includes a plurality of second conductive posts extending from the flexible substrate and projecting toward the first face of the microelectronic element, the second conductive posts supporting the flexible substrate over the microelectronic element, at least some of the first conductive posts being offset from the second conductive posts.

In preferred embodiments, at least some of the second conductive posts are electrically conductive, the second conductive posts electrically interconnecting at least some of the contacts of the microelectronic element with at least some of the first conductive posts. At least some of the first conductive posts may be connected to at least some of the contacts by second conductive posts located immediately adjacent to the first conductive posts. The assembly may also include conductive traces provided on the flexible substrate, whereby the conductive traces electrically interconnect at least some of the first conductive posts with at least some of the contacts on the microelectronic element. In certain preferred embodiments, at least one of the conductive traces extends between adjacent conductive posts.

Assemblies in accordance with certain preferred embodiments of the present invention facilitate testing of microelectronic elements and packages having non-planar contacts and interfaces, and avoids the need for specialized, expensive test equipment. In preferred methods according to this aspect of the present invention, movement of the bases of the conductive posts contribute to movement of the tips of the posts, allowing the tips to engage opposing contact pads even where the contact pads themselves are not coplanar with one another.

As noted above, conductive traces may be provided on a flexible substrate for electrically interconnecting at least some of the first conductive posts with at least some of the second conductive posts. These traces may be very short; the length of each trace desirably is equal to the offset distance between a first conductive post and a second conductive post. In preferred forms, this arrangement can prove low-impedance conductive paths between the posts and the microelectronic element, suitable for high-frequency signal transmission.

In another preferred embodiment of the present invention, a microelectronic assembly includes a bare chip or wafer having contacts on a front face thereof. The bare chip or wafer is juxtaposed with a flexible substrate having conductive posts on a top surface thereof and conductive terminals on a bottom surface thereof. At least some of the conductive posts are not aligned with some of the conductive terminals. The conductive posts are preferably interconnected with the conductive terminals. During assembly, the tip ends of the conductive post are abutted against the contacts of the chip or wafer for electrically interconnecting the chip or wafer with the conductive terminals on the flexible substrate. An encapsulant may be provided between the chip/wafer and the flexible substrate. Conductive elements such as solder or tin/gold may be provided in contact with the conductive terminals. The misalignment of the conductive terminals with the conductive posts provides compliancy to the package and enables the conductive terminals to move relative to the chip/wafer. In certain preferred embodiments, the conductive posts have an outer layer of gold that is pressed-directly against the chip contacts. In other preferred embodiments, the electrical interconnection between the conductive posts and the contacts is formed using an anisotropic conductive film or an anisotropic conductive paste, whereby the conductive particles are disposed between the conductive posts and the contacts. In another preferred embodiment of the present invention, the encapsulant for holding the chip/wafer and the flexible substrate together includes a non-conductive film or paste.

These and other preferred embodiments of the present invention will be described in more detail below.

BRIEF DESCRIPTION OF THE DRAWINGS

FIGS. 5A-5C show a method of making a stacked microelectronic assembly, in accordance with another preferred embodiment of the present invention.

FIGS. 6A-6B show a method of making a stacked microelectronic assembly, in accordance with still another preferred embodiment of the present invention.

DETAILED DESCRIPTION

Figure 1A:
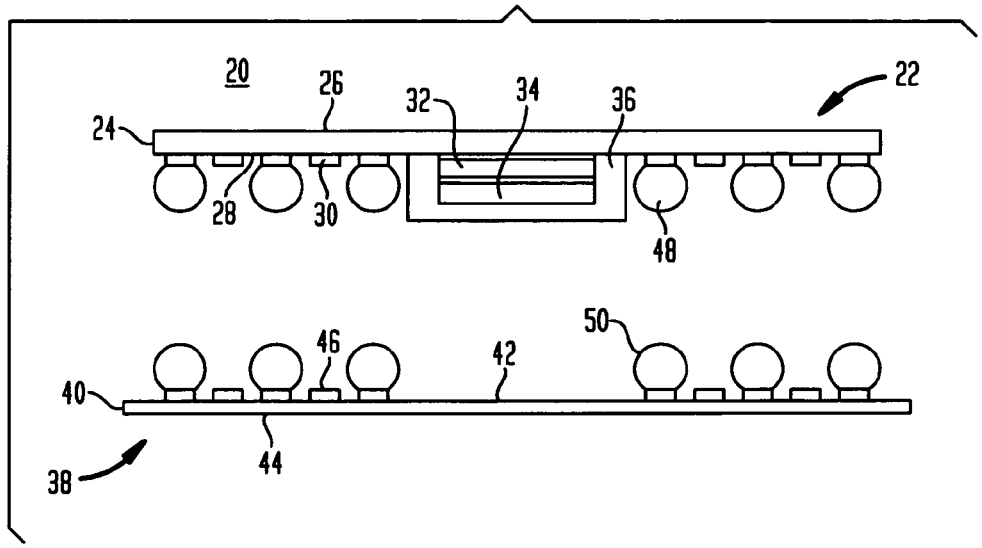
FIGS. 1A-1E show prior art methods of making a microelectronic assemblies.
Figure 1B:
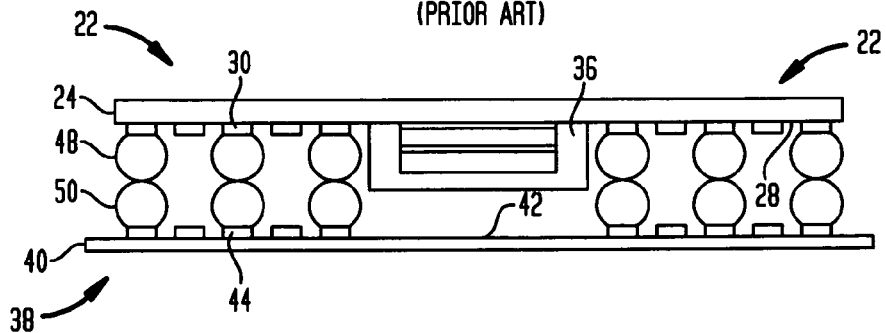
Figure 1C:
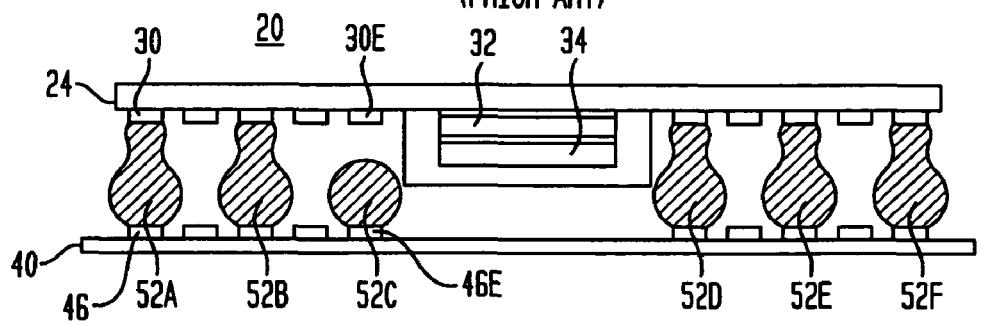

FIGS. 1A-1C show a conventional method of making a stackable assembly including a first microelectronic package 22 having a dielectric substrate 24 with a first surface 26 and a second surface 28. The first microelectronic package 22 includes conductive pads 30 accessible at the second surface 28 of the substrate 24. The first microelectronic package 22 also includes a first microelectronic element 32, such as a semiconductor chip, attached to the second surface 28 of the substrate 24. The microelectronic package 22 also includes a second microelectronic element 34 overlying the first microelectronic element 32. An encapsulating material 36 covers the first and second microelectronic elements 32, 34.

Referring to FIG. 1A, the microelectronic assembly also includes a second microelectronic element 38 including a substrate 40 having a first surface 42 and a second surface 44. The first surface 42 of the substrate 40 includes contacts 46 accessible at the first surface. During assembly, the conductive pads 30 of the first substrate 24 are preferably placed in alignment with the contacts 46 of the second substrate 40. In order to span or bridge the height of the encapsulant layer 36 so as to ensure a reliable electrical interconnection, first solder balls 48 are placed atop some of the conductive pads 30 of the first substrate 24 and second solder balls 50 are placed atop some of the contacts 46 of the second substrate 40.

As shown in FIG. 1A, the first substrate 24 includes five conductive pads 30 that are positioned to the left of the encapsulated microelectronic elements 32, 34 and five conductive pads that are positioned to the right of the encapsulated microelectronic elements. As will be explained in more detail below, due to the height between the first and second microelectronic packages that must be spanned, and due to the size of the solder balls required to span the gap, a solder ball may not be positioned atop each of the conductive pads 30 or contacts 46. As a result, only some of the aligned conductive pads 30 and contacts 46 may have conductive material extending therebetween.

Referring to FIG. 1B, after the first and second microelectronic elements are juxtaposed with one another, the first solder balls 48 of the first microelectronic package are abutted against the second solder balls 50 of the second microelectronic package. As shown in FIG. 1B, the first and second sets of solder balls 48, 50 are preferably in alignment with one another for electrically interconnecting opposing conductive pads 30 and contacts 46. The first and second solder balls 48, 50 preferably have a size sufficient to span the gap between the first and second microelectronic packages 22, 38 for forming an electrical interconnection therebetween. In the FIG. 1B embodiment, the solder balls have a significantly greater height than the height of the encapsulant layer 36. However, the combined height of the aligned first and second solder balls 48, 50 must only be sufficient to span the gap between the layers formed by the encapsulant layer 36.

Referring to FIG. 1C, after the opposing solder balls 48, 50 are in contact with one another, the solder masses may be reflowed, such as by heating the solder masses, to form conductive masses, some of which extend between the conductive pads 30 of the first substrate 24 and the contacts 46 of the second substrate 40. In the particular embodiment shown in FIG. 1C, the microelectronic assembly 20 includes three conductive masses on the left side of the encapsulated microelectronic elements 32, 34 and three conductive masses on the right side thereof. Due to surface tension, the conductive masses 52 tend to be thinner at the top and thicker at the bottom. As shown in FIG. 1C, the conductive masses 52A, 52B, 52D, 52E and 52F have a tear drop like shape that is thicker at the bottom than at the top. The conductive mass 52C has collapsed into a spherical-shaped mass. As a result, the conductive mass 52C is incapable of forming an electrical interconnection between conductive pad 30E and contact 46E.

Figure 1D:
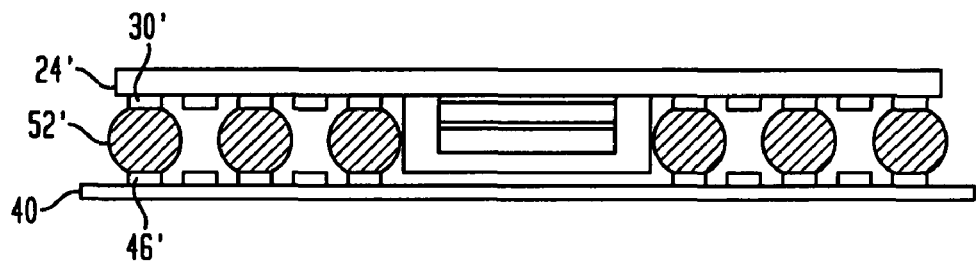

One solution for insuring that the conductive masses 52' are able to bridge the gap between the conductive pads 30' of a first substrate 24' and the contacts 46' on a second substrate 40' is shown in FIG. 1D. In the assembly shown in FIG. 1D, the two substrates 24' and 40' are brought closer together than the spacing shown in the FIG. 1C embodiment. The conductive masses 52', however, tend to widen out and overlap the adjacent conductive pads 30' and contacts 46'. As a result, conductive masses cannot be placed between all of the aligned conductive pads 30 and contacts 46. If conductive masses such as solder balls were placed on all of the aligned conductive pads 30' and contacts 46', the conductive material on one conductive pad or contact would contact an adjacent conductive pad or contact or the conductive material on the adjacent conductive pads and/or contacts. In certain instances, the conductive solder material on adjacent conductive pads and/or contacts would flow together during reflow, which would cause, inter alia, shorting of the microelectronic assembly.

Figure 1E:
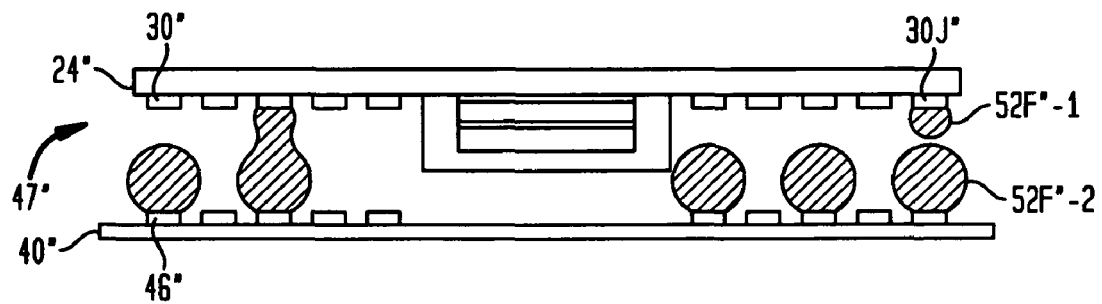

FIG. 1E shows additional problems that occur when attempting to counteract the problems caused by the FIG. 1D embodiment. In FIG. 1E, the first substrate 24" and the second substrate 40" are spaced away from one another by a sufficient distance, which seeks to avoid the lateral bunching problems shown in FIG. 1D. As the substrates are moved away from each other, surface tension and gravity may cause the conductive material, such as solder balls, to collect only on the contacts 46", with gaps 47" spanning between the conductive pads 30" of the first substrate 24" and the contacts 46" of the second substrate 40". Two smaller conductive masses may also form between opposed conductive pads and contacts, such as the smaller conductive mass 52F"-1 on conductive pad 30J" and the larger conductive mass 52F"-2 on contact 46J".

Figure 2A:
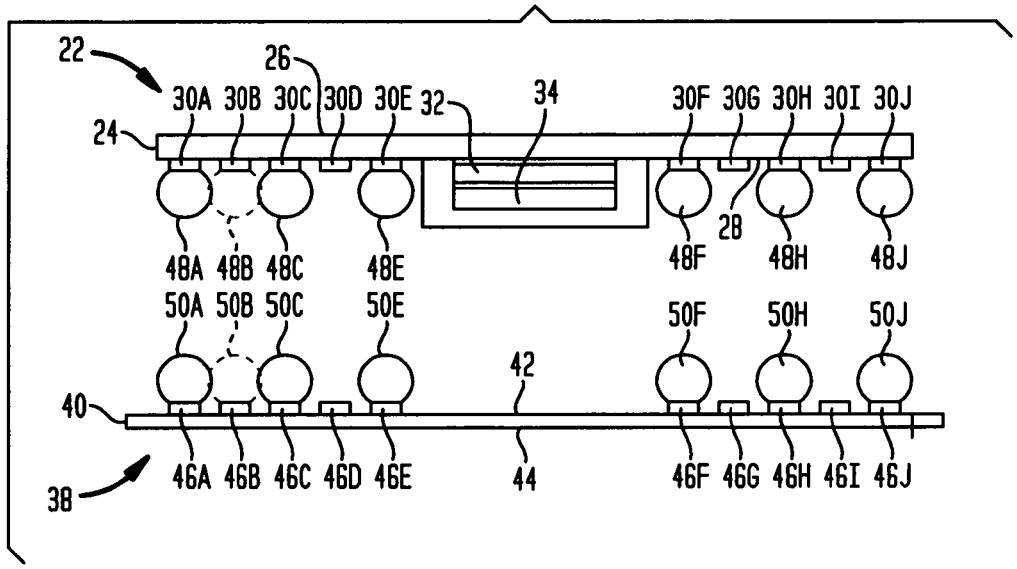
FIGS. 2A-2B show another view of the prior art microelectronic assembly shown in FIGS. 1A-1B.
Figure 2B:
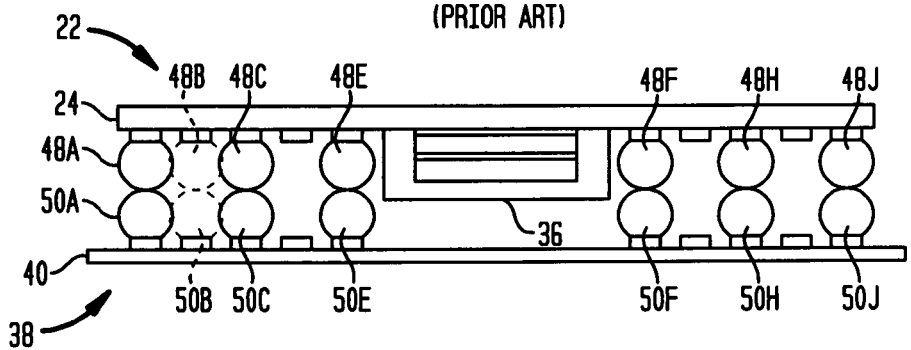

FIGS. 2A and 2B show some of the above-described problems that occur when solder balls are placed on each of the aligned conductive pads and contacts. Referring to FIG. 2A, first microelectronic package 22 includes first substrate 24 having a first surface 26 and a second surface 28 remote therefrom. The first substrate 24 includes five conductive pads 30A-30E located to the left of the encapsulated microelectronic elements 32, 34 and five conductive pads 30F-30J located to the right of the encapsulated first and second microelectronic elements 32, 34. Solder balls 48A, 48C and 48E are positioned atop respective conductive pads 30A, 30C and 30E. Similarly, solder balls 48F, 48H and 48J are positioned atop respective conductive pads 30F, 30H and 30J. No solder balls are positioned atop conductive pads 30B, 30D, 30G and 30I. This is because the solder balls 48 are too large to be positioned atop each of the conductive pads 30. Phantom solder ball 48B shows that there is insufficient room atop conductive pads 30A-30C to place a solder ball atop each of the conductive pads. If such an arrangement were attempted, the three solder balls 48A-48C would be in contact with one another during a reflow operation, which would result in short circuiting of the electronic assembly or the formation of a defective electrical interconnection.

FIG. 2A also shows second microelectronic package 38 including second substrate 40 having first surface 42 and second surface 44. Second substrate 40 includes contacts 46A-46J. Solder balls 50 are positioned atop some of the contacts 46A-46J. Specifically, solder balls 50A, 50C and 50E are positioned atop contacts 46A, 46C and 46E, respectively. In addition, solder balls 50F, 50H and 50J are positioned atop contacts 46F, 46H and 46J, respectively. A solder ball is not positioned atop contact 46B, because placing a solder on this contact would result in solder balls 50A-50C contacting one another, which would lead to a short circuit or a defective electrical interconnection.

Referring to FIG. 2B, during assembly, the first microelectronic package 22 is juxtaposed with the second microelectronic package 38 so that conductive pads 30A-30J are in substantial alignment with contacts 46A-46J. The solder balls 48A, 48C, 48E, 48F, 48H and 48J on the conductive pads are placed in contact with the second solder balls 50A, 50C, 50E, 50F, 50H and 50J on the second microelectronic package 38. The height of the stack solder balls is sufficient to span the gap created by the height of the encapsulant layer 36. Due to an inadequate amount of space, solder balls are not positioned between all of the aligned conductive pads and contacts. Specifically, solder balls are not positioned between at least conductive pad 30B and contact 46B because there is insufficient space over the opposing surfaces of the first and second substrates 24, 40. Although phantom solder balls 48B, 50B are shown, such solder balls are in fact not located atop the opposing conductive pad 30B and contact 46B. The phantom solder balls are only shown to indicate the space problems and the shorting problems that would occur if solder balls were placed atop each of the aligned conductive pads and contacts.

Thus, FIGS. 1A-1C and 2A-2B show some of the problems associated with using solder balls or solder masses for spanning the gap between layers of a stacked microelectronic assembly. As noted above, one of the problems is related to the distance or gap space between the opposing contacts or conductive pads. In order to adequately span the height between the layers, the solder masses must have a sufficient diameter to span the height. Unfortunately, as the diameter of the solder masses increases for spanning the height, the number of solder balls that may be placed side by side atop a substrate surface decreases. Thus, the number of vertically extending electrical connections that may be formed between the layers in the stack is reduced. In view of these deficiencies, there is a need for providing stacked microelectronic assemblies that have a fine pitch.

Figure 3:
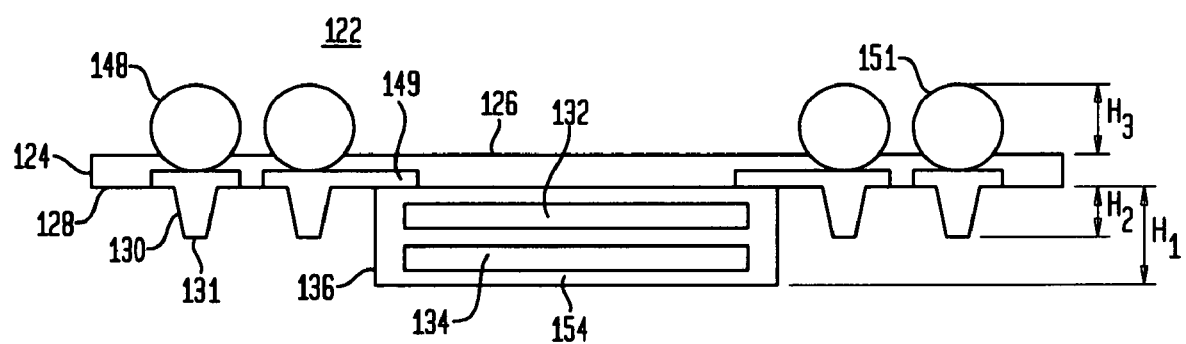
FIG. 3 shows a cross-sectional view of a microelectronic package, in accordance with certain preferred embodiments of the present invention.

FIG. 3 shows a microelectronic package 122, in accordance with certain preferred embodiments of the present invention. The microelectronic package includes a substrate 124, such as a flexible dielectric substrate, having a first surface 126 and a second surface 128 remote therefrom. The microelectronic package includes conductive posts 130 projecting from the second surface 128 of the flexible substrate 124. The conductive posts 130 have tips 131 that are remote from the second surface 128 of the substrate 124. The microelectronic package 122 also includes a first microelectronic element 132 overlying the second surface 128 of substrate 124 and a second microelectronic element 134 overlying the first microelectronic element 132. The first and second microelectronic element 132, 134 are encapsulated in an encapsulant layer 136.

The microelectronic package 122 also includes fusible masses 148, such as solder balls, that are accessible at the first surface 126 of the substrate 124. The fusible masses 148 are preferably in electrical contact with one or more of the conductive posts 130. The microelectronic package 122 also preferably includes conductive traces 149 extending throughout the substrate 124. The conductive traces 149 may be in electrical contact with one or more of the conductive posts 130 and/or one or more of the fusible masses 148. The conductive traces 149 may extend over the first surface 126, the second surface 128 and/or in between the first and second surfaces 126, 128 of the substrate 124.

The encapsulant material 136 has a bottom surface 154 that defines a height $H_1$ extending between the bottom surface 154 and the second surface 128 of the substrate 124. The conductive posts 130 define a second height $H_2$ extending between the tips 131 of the conductive posts and the second surface 128 of the substrate 124. As will be described in more detail below, the height $H_2$ of the conductive posts and the height of opposing solder masses that will engage the tips 131 of the conductive posts 130 must be sufficient to span the gap created by the height $H_1$ of the encapsulant layer 136. The solder masses 148 have an apex 151 that defines a height $H_3$ extending between the apex 151 of the solder masses and the first surface 126 of the substrate 124. As will be described in more detail below, when two or more of the microelectronic packages shown in FIG. 3 are stacked atop one another, the height $H_2$ of the conductive posts and the height $H_3$ of the solder masses 148 above the first surface 126 of the substrate 124 is generally equal to or greater than the height of the encapsulant layer 136 so as to span the gap created by the height of the encapsulant layer 136.

Figure 4A:
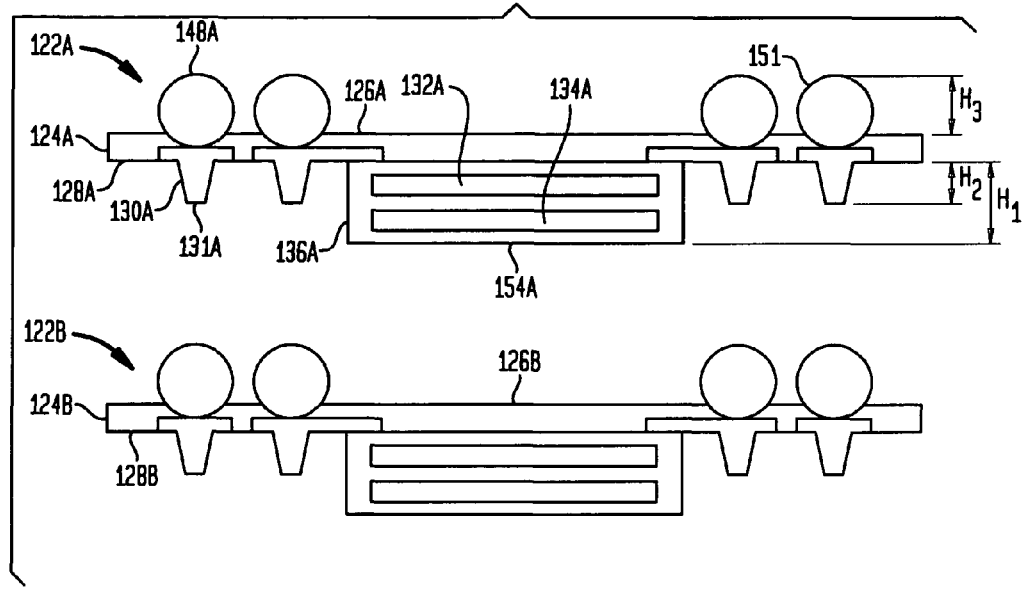
FIGS. 4A-4C show a method of making a stacked microelectronic assembly, in accordance with certain preferred embodiments of the present invention.

FIG. 4A shows two microelectronic packages 122A, 122B that are similar to the package shown in FIG. 3. The first microelectronic package 122A includes substrate 124A, conductive posts 130A, fusible masses 148A and encapsulated microelectronic elements 132A, 134A. The microelectronic elements 132A, 134A are encapsulated by an encapsulant layer 136A having a bottom surface 154A. The bottom surface 154A of the encapsulant layer 136A defines a first height $H_1$ extending between the second surface 128A of the substrate 124A and the bottom surface 154A of the encapsulant layer 136A. The conductive posts 130A define a second height $H_2$ extending between tips 131A thereof and the second surface 128A of the substrate 124A. The solder masses 148A define a third height $H_3$ extending between the apex 151A of the solder masses and the first surface 126A of the substrate 124A. The second microelectronic package 122B includes a substrate 124B having a first surface 126B and a second surface 128B.

Figure 4B:
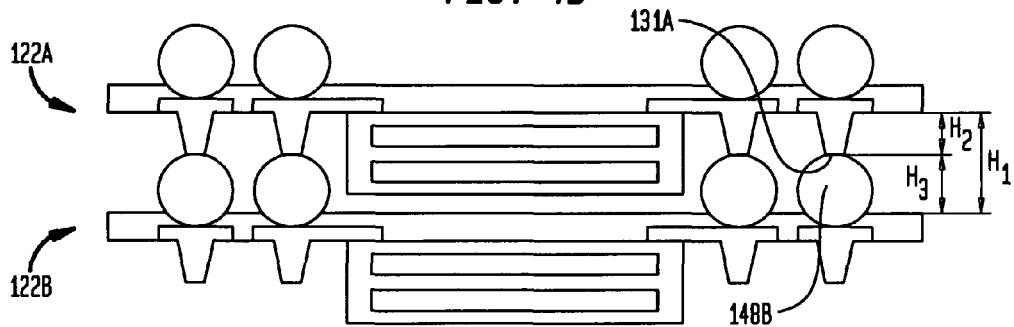

Referring to FIG. 4B, the first microelectronic package 122A is stacked atop the second microelectronic package 122B, with the tips 131A of the conductive posts engaging the apexes of the solder masses 148B. The combined height $H_2$ of the conductive posts and the height $H_3$ of the solder masses is preferably equal to or greater than the height $H_1$ of the encapsulant layer 136A.

Figure 4C:
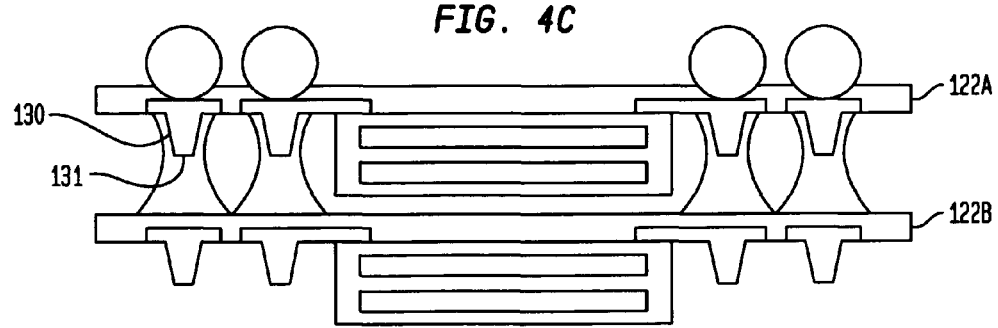

Referring to FIG. 4C, after the tips 131 of the conductive posts 131 are abutted against the fusible masses, the fusible masses are reflowed, such as by heating, for transforming the fusible masses into an at least partially molten state. The reflowed fusible material preferably wicks up around the outer surfaces of the conductive posts. While in the reflowed state, the fusible masses use surface tension forces to self-center the conductive posts. As a result, the conductive posts of the first microelectronic package 122A are preferably in substantial alignment with the conductive posts of the second microelectronic package 122B. The surface tension also pulls the first microelectronic package 122A and the second microelectronic package 122B toward one another.

Figure 5A:
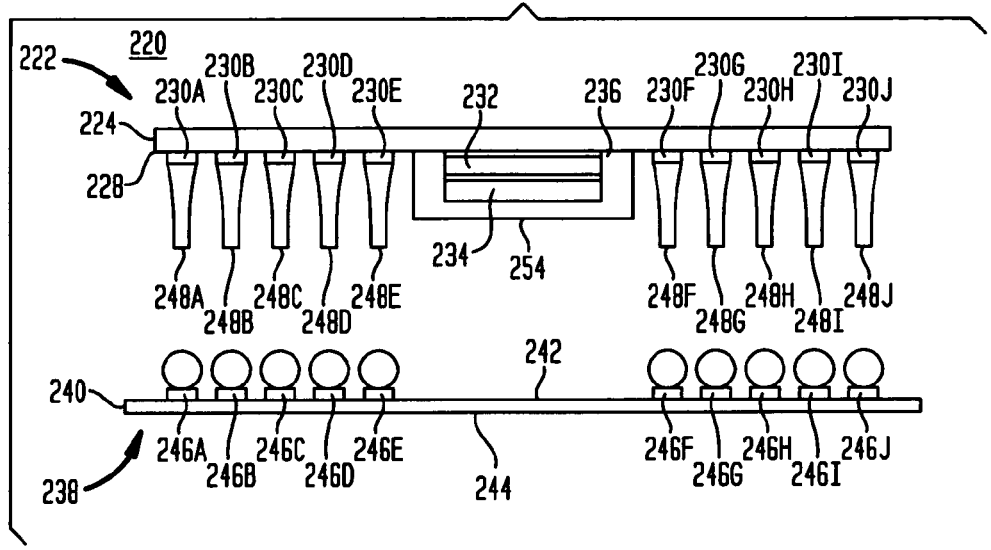
Figure 5B:
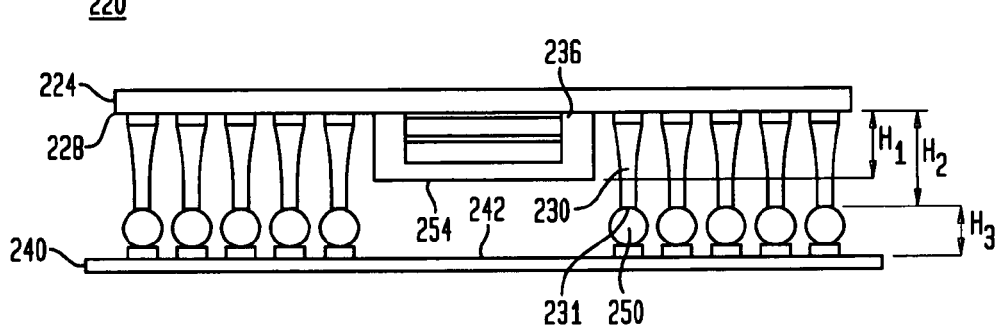

FIGS. 5A-5C show a microelectronic assembly 220, in accordance with another preferred embodiment of the present invention. The microelectronic assembly 220 includes a first microelectronic element 222 having a substrate 224 with a first surface 226 and a second surface 228 remote therefrom. The first substrate 224 includes conductive pads 230A-230J accessible at the second surface 228. The first microelectronic package 222 also has one or more microelectronic elements, such as semiconductor chips, attached to the substrate. In the particular embodiment shown in FIG. 5A, the first microelectronic package 222 includes a first microelectronic element 232 overlying the second surface 228 and the second microelectronic element 234 overlying the first microelectronic element. An encapsulant layer 236 covers the microelectronic elements 232, 234. The encapsulant layer has a bottom surface 254, which defines a distance between the bottom surface of the encapsulant layer and the second surface 228 of the substrate 224.

The conductive pads 230A-230J have a similar spacing as shown in the embodiments of FIGS. 1A and 2A. However, the particular embodiments of FIG. 5A uses elongated conductive posts 248A-248J, rather than the solder masses shown in the FIGS. 1A and 2A embodiments. As a result, there is sufficient space for one conductive post 248 to project from each of the conductive pads 230, without adjacent conductive posts contacting one another as occurs when using solder balls on both the conductive pads and the contacts, as shown above in the FIGS. 1A and 2A embodiments. Thus, it is possible to have more inputs/outputs from the first microelectronic package 222 and form more electrical interconnections.

The microelectronic assembly 220 also includes a second microelectronic package 238 having a second substrate 240 with a first surface 242 and a second surface 244 remote therefrom. The first surface 242 includes contacts 246A-246J. Solder balls 250 are positioned atop each of the contacts 246A-246J.

Referring to FIG. 5B, the first surface 228 of the first substrate 224 is juxtaposed with the first surface 242 of the second substrate 240. The tips 231 of conductive posts 248 are abutted against the apexes of the solder balls 250. The bottom surface 254 of the encapsulant layer 236 defines a height $H_1$ that extends between the bottom surface 254 of the encapsulant layer and the second surface 228 of the substrate 224. Conductive posts 230 define a height $H_2$ that extends between posts tips 231 and the second surface 228 of the first substrate 224. The solder balls 250 define a height $H_3$ that extends between the apex of the solder balls and the first surface 242 of the second substrate 240. The combined heights $H_2$ and $H_3$ of the conductive posts and the solder balls is equal to or greater than the height $H_1$ of the encapsulant layer 236. As a result, the combination of the conductive posts 230 and the solder balls 250 is sufficient to span the gap created by the height of the encapsulant layer.

FIG. 5C shows the microelectronic assembly 220 after the solder material 250 has been reflowed and wicks up the sides of the conductive posts 230. As the solder material 250 wicks up the sides of the conductive posts, surface tension pulls the first microelectronic package 222 and the second microelectronic package 238 toward one another. In addition, the reflowed solder material provide a self-centering function, whereby the conductive posts 230 are centered atop the contacts 246 of the second microelectronic package 238.

FIGS. 6A and 6B show the self-centering feature of the present invention. Referring to FIG. 6A, a first microelectronic package 322A is juxtaposed with a second microelectronic package 322B. The tips of the conductive posts 330 are abutted against the solder masses 348 on the second microelectronic package 322B. In this particular embodiment, the conductive posts 330 are at least partially misaligned with the solder masses 348. The misalignment is shown in FIG. 6A, whereby a conductive post 330D on the first microelectronic package 322A extends along an axis $A_1$ and a conductive posts 330D' on the second microelectronic package 322B extends along an axis $A_2$ that is different than $A_1$. As a result, the conductive posts on the first microelectronic package are not in substantial alignment with the solder masses 348 on the second microelectronic package 322B.

Referring to FIG. 6B, during reflow of the solder on the second microelectronic package 322B, the reflowed solder wicks around the outer surfaces of the conductive posts and provides a self-centering action so that the conductive posts of the first microelectronic package are 322A are urged into substantial alignment with the conductive posts of the second microelectronic package 322B. As shown in FIG. 6B, the first conductive posts of the first microelectronic package 322A are aligned along axis $A_1$ and the second conductive posts of the second microelectronic package are aligned along axis $A_2$, whereby axes $A_1$ and $A_2$ now lie in a common axis. As a result of the self-centering action, the conductive posts of the first and second microelectronic packages 322A, 322B are now in substantial alignment with one another.

FIG. 6B shows direction arrow D, which depicts movement of the first microelectronic package 322A relative to the second microelectronic package 322B during reflow of the solder masses. In addition, as noted above, the reflowed solder provides surface tension that pulls the first and second microelectronic packages 322A, 322B toward one another.

Figure 7:
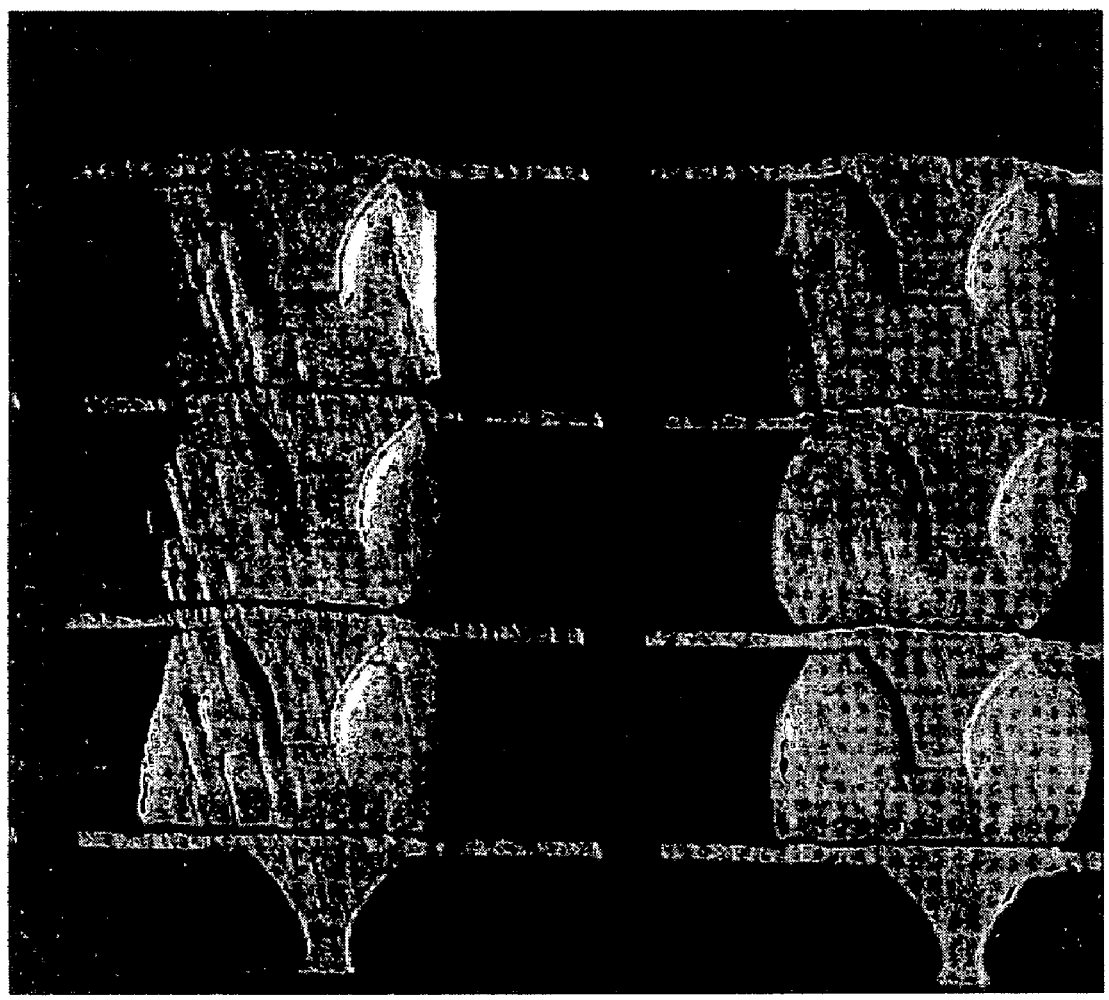
FIG. 7 shows a cross-sectional view of a stacked microelectronic assembly, in accordance with certain preferred embodiments of the present invention.

FIG. 7 shows a partial cross-sectional view of a stacked microelectronic assembly, which includes four stacked layers. The conductive posts of an upper layer are electrically interconnected with the fusible conductive masses of a lower layer. During assembly, the tips of the posts are placed in contact with the opposing fusible conductive masses. The fusible masses are then reflowed, whereby the reflowed masses wick up around the outer surfaces of the conductive posts.

In certain preferred embodiments, the substrate may be a flexible dielectric substrate, such as a polyimide or other polymeric sheet, including a top surface and a bottom surface remote therefrom. Although the thickness of the dielectric substrate may vary with the application, the dielectric substrate most typically is about 10 µm-100 µm thick. The flexible sheet preferably has conductive traces thereon. The conductive traces may extend on the top surface of the flexible sheet, on both the top and bottom faces or within the interior of the flexible substrate. Thus, as used in this disclosure, a statement that a first feature is disposed "on" a second feature should not be understood as requiring that the first feature lie on a surface of the second feature. Conductive traces may be formed from any electrically conductive material, but most typically are formed from copper, copper alloys, gold or combinations of these materials. The thickness of the traces will also vary with the application, but typically is about 5 µm-25 µm. The conductive traces may be arranged so that each trace has a support end and a post end remote from the support end.

As noted above, in certain preferred embodiments, the electrically conductive posts project from a surface of the substrate. Each post may be connected to a post end of one of the conductive traces. In certain preferred embodiments, the conductive posts may extend upwardly through the substrate, from the post ends of the traces. The dimensions of the conductive posts may vary over a significant range, but most typically the height of each post above a surface of the flexible sheet is about 50-300 µm. Each post preferably has a base adjacent the substrate and a tip remote from the substrate. The conductive posts may have a frustoconical shape, whereby the base and tip of each post are substantially circular. The bases of the posts typically are about 100-600 µm in diameter, whereas the tips typically are about 40-600 µm in diameter and more preferably about 40-200 µm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

The dielectric substrate, traces and posts may be fabricated by a process such as that disclosed in co-pending, commonly assigned U.S. patent application Ser. No. 10/959,465, filed Oct. 6, 2004, the disclosure of which is incorporated by reference herein. As disclosed in greater detail in the '465 application, a metallic plate is etched or otherwise treated to form numerous metallic posts projecting from the plate. A dielectric layer is applied to this plate so that the posts project through the dielectric layer. An inner or side of the dielectric layer faces toward the metallic plate, whereas the outer side of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

In certain preferred embodiments of the present invention, the conductive posts are free to move independently of one another. The independent displacement of the posts relative to one another allows all of the post tips to contact all of the contacts on an opposing microelectronic element. For example, the flexible substrate in the vicinity of a first conductive post is able to flex substantially more than the flexible substrate in the vicinity of a second conductive post. Because all of the post tips can be engaged reliably with all of the contacts of an opposing microelectronic element, the package can be tested reliably by applying test signals, power and ground potentials through the test circuit board and through the engaged posts and contact pads. Moreover, this reliable engagement is achieved with a simple test circuit board. For example, the contact pads of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 µm of pin movement will suffice.

In certain preferred embodiments of the present invention, after a microelectronic package has been tested, the package may be removed from the test circuit board and permanently interconnected with another substrate such as a circuit panel having contact pads, as by bonding the tips of posts to the contact pads of the circuit panel using a conductive bonding material such as a solder. The solder-bonding process may be performed using conventional equipment commonly used for surface-mounting microelectronic components. Thus, the solder masses may be provided on the posts or on the contact pads, and may be reflowed after engaging the posts with the contact pads. During reflow, the surface tension of the solder tends to center the posts on the contact pads. Such self-centering action is particularly pronounced where the tips of the posts are smaller than the contact pads. Moreover, the solder wets the sides of the posts to at least some extent, and thus forms a fillet encircling the tip of each post, as well as a strong bond between the confronting surfaces of the posts and pads.

An underfill material (not shown) such as an epoxy or other polymeric material may be provided around the tips of the posts and around the contact pads, so as to reinforce the solder bonds. Desirably, this underfill material only partially fills the gap between the package and the circuit board. In this arrangement, the underfill does not bond the flexible substrate or the microelectronic device to the circuit board. The underfill only reinforces the posts at their joints with the contact pads. However, no reinforcement is required at the bases of the posts, inasmuch as the joint between the base of each post and the associated trace is extraordinarily resistant to fatigue failure.

The foregoing discussion has referred to an individual microelectronic element. However, the package may include more than one microelectronic element or more than one substrate. Moreover, the process steps used to assemble the flexible substrate, support elements and posts to the chips may be performed while the chips are in the form of a wafer. A single large substrate may be assembled to an entire wafer, or to some portion of the wafer. The assembly may be severed so as to form individual units, each including one or more of the chips and the associated portion of the substrate. The testing operations discussed above may be performed prior to the severing step. The ability of the packages to compensate for non-planarity in a test board or in the wafer itself greatly facilitates testing of a large unit.

The substrate and traces may deform locally in regions surrounding the posts. These regions tend to deform upwardly, leaving concavities in the bottom surface of the substrate. The posts may have heads, and these heads may be lodged partially or completely within the concavities. To control deformation of the substrate, the top surface of the substrate may be abutted against a die having holes aligned with locations where posts are forced through the substrate. Such a die can also help to prevent delamination of the substrate and traces. In variants of the process, the traces may be disposed on the top or bottom surface of a single-layer substrate. The resulting post-array substrate can be assembled with a microelectronic element to form a package as discussed above, or can be used in any other microelectronic assembly where a small post array is desirable. The assembly process allows selective placement of posts. It is not essential to provide the lands and holes in the traces. Thus, posts can be placed at any location along any trace. Moreover, the posts may be formed from essentially any conductive material. Different posts may be formed from different materials. For example, posts subject to severe mechanical loading can be formed entirely or partially from hard refractory metals such as tungsten, while other posts may be formed from softer metals such as copper. Also, some or all of the posts may be formed entirely or partially from corrosion-resistant metals such as nickel, gold or platinum.

As described above in earlier embodiments, the conductive posts are free to move independently of other conductive posts so as to ensure reliable contact between each conductive post and each conductive pad on a test board. The tips of the conductive posts are able to move so as to compensate for potential differences in vertical spacing so that all of the tips can be brought into contact with all of the conductive pads simultaneously using with only a moderate vertical force applied to urge a testable package and a test board together. In this process, at least some of the tips of the conductive posts are displaced in the vertical or z direction relative to others of the post tips. Further, different portions of the flexible substrate associated with different conductive posts can deform independently of one another. In practice, the deformation of the substrate may include bending and/or stretching of the substrate so that the motion of the base may include a tilting about an axis in the x-y or horizontal plane as well as some horizontal displacement of the base, and may also include other components of motion.

The tips of the posts may not be precisely coplanar with one another, due to factors such as non-planarity of the front surface of the microelectronic device; warpage of the dielectric substrate; and unequal heights of the posts themselves. Also, the package may be tilted slightly with respect to the circuit board. For these and other reasons, the vertical distances between the tips of the posts and the contact pads may be unequal. The independent displacement of the posts relative to one another allows all of the post tips to contact all of the contact pads on an opposing microelectronic package.

Because all of the post tips can be engaged reliably with all of the contact pads, the package can be tested reliably by applying test signals, power and ground potentials through the test circuit board and through the engaged posts and contact pads. Moreover, this reliable engagement is achieved with a simple test circuit board. For example, the contact pads of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 μm of pin movement will suffice.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As discussed above, the motion of the posts may include a tilting motion. This tilting motion causes the tip of each post to wipe across the contact pad as the tip is engaged with the contact pad. This promotes reliable electrical contact. As discussed in greater detail in the co-pending, commonly assigned application Ser. No. 10/985,126 filed Nov. 10, 2004, entitled "MICRO PIN GRID ARRAY WITH WIPING ACTION", the disclosure of which is incorporated by reference herein, the posts may be provided with features which promote such wiping action and otherwise facilitate engagement of the posts and contacts. As disclosed in greater detail in the co-pending, commonly assigned application Ser. No. 10/985,119 filed Nov. 10, 2004, entitled "MICRO PIN GRID WITH PIN MOTION ISOLATION", the disclosure of which is also incorporated by reference herein, the flexible substrate may be provided with features to enhance the ability of the posts to move independently of one another and which enhance the tilting and wiping action.

In certain preferred embodiments of the present invention, a microelectronic package, assembly or stack may include one or more features of one or more of the embodiments disclosed in U.S. application Ser. No. 10/959,465, filed Oct. 6, 2004, entitled "Formation of Circuitry With Modification of Feature Height"; U.S. application Ser. No. 11/166,861, filed Jun. 24, 2005, entitled "Structure With Spherical Contact Pins"; U.S. application Ser. No. 11/014,439, filed Dec. 16, 2004, claiming priority of U.S. Provisional Application Ser. No. 60/533,210, filed Dec. 30, 2003; U.S. application Ser. No. 10/985,126, filed Nov. 10, 2004, claiming priority of U.S. Provisional Application Ser. No. 60/533,393, filed Dec. 30, 2003; U.S. application Ser. No. 10/985,119, filed Nov. 10, 2004, claiming priority of U.S. Provisional Application Ser. No. 60/533,437, filed Dec. 30, 2003; U.S. patent application Ser. No. 11/140,312, filed May 27, 2005, claiming priority of U.S. Provisional Application Ser. No. 60/583,066, filed Jun. 25, 2004 and U.S. Provisional Application Ser. No. 60/621,865, filed Oct. 25, 2004; U.S. Provisional Application Ser. No. 60/662,199, filed Mar. 16, 2005; U.S. Patent Application Publication No. 2005/0035440; and U.S. Provisional Application Ser. No. 60/753,605, filed Dec. 23, 2005, entitled "MICROELECTRONIC PACKAGES AND METHODS THEREFOR", the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method making a stacked microelectronic assembly comprising:

providing a first microelectronic package including a first substrate, the first substrate including a first dielectric layer, conductive posts having tips overlying said first dielectric layer at a vertical height from a surface of said first dielectric layer, and conductive traces extending along said surface of said first dielectric layer, wherein said conductive posts have bases extending in a vertical direction away from said conductive traces, said posts being formed integrally with said traces;

providing a second microelectronic package including a second substrate, the second substrate including a second dielectric layer, conductive, fusible masses having apexes overlying said second dielectric layer at a vertical height from a surface of said second dielectric layer, contacts exposed at said surface of said second substrate supporting said fusible masses, and conductive traces extending from said contacts along said surface of said second dielectric layer;

securing a microelectronic element to one of the surfaces of at least one of said first or second substrates such that said first and second dielectric layers extend beyond edges of said microelectronic element, said microelectronic element defining a vertical height that extends from the one of the surfaces of said at least one of said first or second substrates to which said microelectronic element is secured; and joining said conductive posts of said first substrate with said fusible masses of said second substrate, and wherein the vertical height of each said conductive post/fusible mass combination is equal to or greater than the vertical height of said microelectronic element, wherein said posts include a plurality of aligned posts which are aligned in a first row extending in a single orthogonal direction along a surface of said first substrate away from a portion of said first substrate that faces a face of said microelectronic element, said aligned posts being disposed beyond one of said edges of said microelectronic element.

2. The method as claimed in claim 1, wherein when reflowing said fusible masses said reflowed fusible masses wick up around outer surfaces of said conductive posts, and wherein surface tension from said reflowed fusible masses pulls said conductive posts toward said second substrate.

3. The method as claimed in claim 1, wherein said dielectric layers are flexible.

4. The method of claim 1, wherein the dielectric layer is comprised of a polymeric material.

5. The method of claim 1, wherein a vertical height of posts is 50-300 microns.

6. A method of making a stacked microelectronic assembly comprising:
providing a first microelectronic substrate including a first dielectric layer having conductive posts extending from a bottom surface of said first dielectric layer and conductive traces extending from said conductive posts along said bottom surface of said first dielectric layer, wherein said conductive posts are formed by etching a metal layer;
providing a second microelectronic substrate including a second dielectric layer having conductive masses accessible at a top surface of said second dielectric layer;
securing at least one microelectronic element over at least one of the bottom surface of said first dielectric layer and the top surface of said second dielectric layer such that at least one of said first and second dielectric layers extend beyond edges of said at least one microelectronic element, wherein said at least one microelectronic element has a height that is less than the combined height of one of said conductive masses and one of said conductive posts; and
joining said conductive posts with said conductive masses,
wherein said posts include a plurality of aligned posts which are aligned in a first row extending in a single orthogonal direction along a surface of said first substrate away from a portion of said first substrate that faces a face of said at least one microelectronic element, said aligned posts being disposed beyond one of said edges of said at least one microelectronic element.

7. A method of making a stacked microelectronic assembly comprising:
providing a first microelectronic package having a first substrate including a first dielectric layer having a top surface and a bottom surface, a microelectronic element overlying the bottom surface of said dielectric layer, conductive posts extending from the bottom surface of said first dielectric layer, and conductive traces extending along said bottom surface of said first dielectric layer, and the first dielectric layer extending beyond edges of said microelectronic element, wherein said conductive posts have bases extending in a vertical direction away from said conductive traces, said posts being formed integrally with said traces,
wherein said posts include a plurality of aligned posts which are aligned in a first row extending in a single orthogonal direction away from a portion of said first substrate facing a face of said microelectronic element, said aligned posts being disposed beyond one of said edges of said microelectronic element;
providing a second microelectronic package having a second substrate including a second dielectric layer having a top surface and a bottom surface, conductive posts, fusible masses accessible at the top surface of said second dielectric layer and contacts supporting said fusible masses; and
positioning the tips of said conductive posts adjacent said conductive, fusible masses for electrically interconnecting said first and second substrates, wherein the height of each said conductive post/conductive, fusible mass combination is equal to or greater than the height of said microelectronic element secured to the bottom surface of said first substrate; and
then reflowing said fusible masses, wherein surface tension from said reflowed fusible masses centers the tips of said conductive posts over the contacts of said second substrate.

8. The method as claimed in claim 7, wherein when reflowing said conductive, fusible masses said reflowed fusible masses engage sides of said conductive posts.

9. The method as claimed in claim 7, wherein said conductive posts extending from the bottom surface of said first dielectric layer have a height that is greater than the height of said microelectronic element overlying the bottom surface of said dielectric layer.

10. The method as claimed in claim 7, further comprising providing second conductive posts extending from the bottom surface of said second dielectric layer.

11. The method as claimed in claim 10, further comprising providing a second microelectronic element overlying the bottom surface of said second dielectric layer.

12. The method as claimed in claim 11, wherein said second conductive posts extending from the bottom surface of said second dielectric layer has a height that is greater than the height of said second microelectronic element overlying the bottom surface of said second substrate.

13. The method as claimed in claim 10, further comprising after electrically interconnecting said first and second substrates, abutting the tips of said second conductive posts against conductive pads of a third substrate for electrically interconnecting said first and second substrates with said third substrate.

14. The method as claimed in claim 7, wherein said first microelectronic element comprises a semiconductor chip.

15. The method as claimed in claim 11, wherein said second microelectronic element comprises a semiconductor chip.

16. The method as claimed in claim 7, wherein said conductive, fusible masses comprise solder.

17. The method as claimed in claim 7, wherein said conductive, fusible masses comprise spheres.

18. The method as claimed in claim 7, further comprising at least partially encapsulating said first microelectronic element overlying the bottom surface of said first dielectric layer.

19. The method as claimed in claim 11, further comprising at least partially encapsulating said second microelectronic element overlying the bottom surface of said second dielectric layer.

20. The method as claimed in claim 13, wherein said third substrate comprises a circuitized substrate.

21. The method as claimed in claim 7, wherein said microelectronic element comprises two microelectronic elements stacked atop one another and overlying the bottom surface of said first dielectric layer.

22. The method as claimed in claim 6, wherein said dielectric layers are flexible.

23. The method as claimed in claim 6, wherein said first and second dielectric layers are flexible.

24. A stacked microelectronic assembly comprising:
a first microelectronic package including a first substrate having a first dielectric layer, conductive posts having tips overlying said first dielectric layer at a vertical height from a surface of said first dielectric layer, and conductive traces extending along said surface of said first dielectric layer, wherein said conductive posts have bases extending in a vertical direction away from said conductive traces, said posts being formed integrally with said traces;
a second microelectronic package juxtaposed with said first microelectronic package, said second microelectronic package including a second substrate having a second dielectric layer, conductive posts having tips overlying said first dielectric layer, conductive, fusible masses extending from a surface of said second dielectric layer, and contacts on said surface of said second dielectric layer supporting said fusible masses, each said fusible mass having a vertical height that extends from the surface of said second dielectric layer to an apex of said fusible mass; and a microelectronic element secured over at least one of the surfaces of said first and second dielectric layers such that said at least one of the first or second dielectric layers extends beyond edges of said microelectronic element, said microelectronic element defining a vertical height that extends from the one of the surfaces of said first and second dielectric layers to which said microelectronic element is secured, wherein the tips of said conductive posts of said first substrate are positioned adjacent the apexes of said fusible masses of said second substrate and wherein the vertical height of each said conductive post/fusible mass combination is equal to or greater than the vertical height of said microelectronic element secured to the one of the surfaces of said first and second substrates, wherein said fusible masses are reflowable so that surface tension from said reflowed fusible masses centers the tips of said conductive posts over the contacts exposed at said second dielectric layer, and wherein said conductive posts of said first substrate include a plurality of aligned posts which are aligned in a first row extending in a single orthogonal direction along a surface of said first substrate away from a portion of said first substrate that faces a face of said microelectronic element, said aligned posts being disposed beyond one of said edges of said microelectronic element.

25. The assembly as claimed in claim 24, wherein said reflowed fusible masses wick up and around outer surfaces of said conductive posts so as to generate surface tension for pulling said conductive posts toward said second substrate.

26. A stacked microelectronic assembly comprising:
a first microelectronic substrate including a first dielectric layer having conductive posts extending from a bottom surface of said first dielectric layer and conductive traces extending along said bottom surface, wherein said conductive posts have bases extending in a vertical direction away from said conductive traces, said posts being formed integrally with said traces;
a second microelectronic substrate including a second dielectric layer having conductive masses accessible at a top surface of said second dielectric layer and contacts on said top surface supporting said conductive masses;
each said conductive post being abutted against one of said conductive masses; and
at least one microelectronic element being secured over at least one of the bottom surface of said first dielectric layer and the top surface of said second dielectric layer such that said first and second dielectric layers extend beyond edges of said microelectronic element, wherein said at least one microelectronic element has a height that is less than the combined height of one of said conductive masses and one of said conductive posts, and
wherein said posts include a plurality of aligned posts which are aligned in a first row extending in a single orthogonal direction along a surface of said first microelectronic element substrate away from a portion of said first microelectronic element substrate that faces a face of said microelectronic element, said aligned posts being disposed beyond one of said edges of said microelectronic element.

27. The assembly as claimed in claim 26, wherein surface tension of said reflowed conductive masses pulls said conductive posts toward said second dielectric layer and centers said conductive posts within said reflowed conductive masses.

28. A stacked microelectronic assembly comprising:
a first microelectronic package having a first substrate, the first substrate including a first dielectric layer with a top surface and a bottom surface, a microelectronic element overlying the bottom surface of said first dielectric layer such that said first dielectric layer extends beyond edges of said microelectronic element, conductive posts extending from the bottom surface of said first dielectric layer and conductive traces extending along said bottom surface of said first dielectric layer, wherein said conductive posts have bases extending in a vertical direction away from said conductive traces, said posts being formed integrally with said traces;
a second microelectronic package juxtaposed with said first microelectronic package, said second microelectronic package having a second substrate, the second substrate including a second dielectric layer with a top surface and a bottom surface, conductive posts having tips overlying said first dielectric layer, fusible masses accessible at said top surface of said second dielectric layer, and contacts on said top surface for supporting said fusible masses; and
the tips of said conductive posts overlying said respective first and second dielectric layers and being abutted against said conductive, fusible masses for electrically interconnecting said first and second substrates, wherein the height of each said conductive post/conductive fusible mass combination is equal to or greater than the height of said microelectronic element secured to the bottom surface of said first substrate,
wherein said posts include a plurality of aligned conductive posts which are aligned in a first row extending in a single orthogonal direction along a surface of said first substrate away from a portion of said first substrate that faces a face of said microelectronic element, said aligned posts being disposed beyond one of said edges of said microelectronic element.

29. The assembly as claimed in claim 28, wherein said conductive, fusible masses are reflowable so that said reflowed fusible masses engage sides of said conductive posts.

30. The assembly as claimed in claim 28, wherein said conductive posts extending from the bottom surface of said first dielectric layer have a height that is greater than the height of said microelectronic element overlying the bottom surface of said first dielectric layer.

31. The assembly as claimed in claim 28, further comprising second conductive posts extending from the bottom surface of said second dielectric layer.

32. The assembly as claimed in claim 31, further comprising a second microelectronic element overlying the bottom surface of said second dielectric layer.

33. The assembly as claimed in claim 32, wherein said second conductive posts extending from the bottom surface of said second dielectric layer have a height that is greater than the height of said second microelectronic element overlying the bottom surface of said second dielectric layer.

34. The assembly as claimed in claim 31, further comprising a third substrate having conductive pads accessible at a surface thereof, wherein the tips of said second conductive posts are electrically interconnected with the conductive pads of said third substrate.

35. The assembly as claimed in claim 28, wherein said first microelectronic element comprises a semiconductor chip.

36. The assembly as claimed in claim 32, wherein said second microelectronic element comprises a semiconductor chip.

37. The assembly as claimed in claim 28, wherein said conductive, fusible masses comprise solder.

38. The assembly as claimed in claim 28, further comprising an encapsulant material at least partially encapsulating said first microelectronic element overlying the bottom surface of said first dielectric layer.

39. The assembly as claimed in claim 32, further comprising an encapsulant material at least partially encapsulating said second microelectronic element overlying the bottom surface of said second dielectric layer.

40. The assembly as claimed in claim 28, wherein said dielectric layers are flexible.

41. A method of making a stacked microelectronic assembly comprising:
 providing a first microelectronic package including a first substrate including a first dielectric layer, conductive posts having tips overlying said first dielectric layer at a vertical height from surface of said first dielectric layer, and conductive traces extending along said surface of said first dielectric layer, wherein said conductive posts have bases extending in a vertical direction away from said conductive traces, said posts being formed integrally with said traces;
 providing a second microelectronic package including a second substrate, the second substrate including a second dielectric layer, conductive, fusible masses having apexes overlying said second dielectric layer at a vertical height from a surface of said second dielectric layer, contacts exposed at said surface of said second substrate supporting said fusible masses, and conductive traces extending from said contacts along said surface of said second dielectric layer;
 securing a microelectronic element to one of the surfaces of at least one of said first or second substrates such that said first and second dielectric layers extend beyond edges of said microelectronic element, said microelectronic element defining a vertical height that extends from the one of the surfaces of the at least one of said first or second substrates to which said microelectronic element is secured;
 positioning the tips of said conductive posts of said first substrate adjacent the apexes of said fusible masses of said second substrate, wherein the vertical height of each said conductive post/fusible mass combination is equal to or greater than the vertical height of said microelectronic element; and
 then reflowing said fusible masses to join the posts with the contacts,
 wherein said conductive posts include a plurality of aligned posts which are aligned in a first row extending in a single orthogonal direction along a surface of said first substrate away from a portion of said first substrate that faces a face of said microelectronic element, said aligned posts being disposed beyond one of said edges of said microelectronic element.

42. The method of claim 4, wherein the dielectric layer is flexible.

43. A method of making a stacked microelectronic assembly comprising:
 providing a first microelectronic package including a first substrate, the first substrate including a first dielectric layer, conductive posts having tips overlying said first dielectric layer at a vertical height from a surface of said first dielectric layer, and conductive traces extending along said surface of said first dielectric layer, wherein said conductive posts are formed by etching a metal layer;
 providing a second microelectronic package including a second substrate, the second substrate including a second dielectric layer, conductive, fusible masses having apexes overlying said second dielectric layer at a vertical height from a surface of said second dielectric layer, contacts exposed at said surface of said second substrate supporting said fusible masses, and conductive traces extending from said contacts along said surface of said second dielectric layer;
 securing a microelectronic element to one of the surfaces of at least one of said first or second substrates such that said first and second dielectric layers extend beyond edges of said microelectronic element, said microelectronic element defining a vertical height that extends from the one of the surfaces of said at least one of said first or second substrates to which said microelectronic element is secured;
 positioning the tips of said conductive posts of said first substrate adjacent the apexes of said fusible masses of said second substrate, and wherein the vertical height of each said conductive post/fusible mass combination is equal to or greater than the vertical height of said microelectronic element,
 wherein said conductive posts include a plurality of aligned posts which are aligned in a first row extending in a single orthogonal direction along a surface of said first substrate away from a portion of said first substrate that faces a face of said microelectronic element, said aligned posts being disposed beyond one of said edges of said microelectronic element.

* * * * *